United States Patent [19]
Yamada et al.

[11] Patent Number: 5,523,564
[45] Date of Patent: Jun. 4, 1996

[54] INFRARED DETECTING ELEMENT

[75] Inventors: Akira Yamada; Takehiko Sato; Yoshikazu Utsumi; Hisao Watarai, all of Amagasaki, Japan

[73] Assignee: Mitsubishi Denki Kabushiki Kaisha, Tokyo, Japan

[21] Appl. No.: 248,154

[22] Filed: May 24, 1994

[30] Foreign Application Priority Data

May 24, 1993 [JP] Japan .................................. 5-121458
Dec. 28, 1993 [JP] Japan .................................. 5-335388

[51] Int. Cl.$^6$ ..................................... G01J 5/20
[52] U.S. Cl. .................. 250/338.1; 250/370.15
[58] Field of Search ............... 250/338.1, 338.2, 250/338.3, 338.4, 370.15, 332

[56] References Cited

U.S. PATENT DOCUMENTS

| | | | |
|---|---|---|---|
| 4,250,384 | 2/1981 | Pulvari | 250/338.4 |
| 4,302,674 | 11/1981 | Adachi et al. | 250/338.3 |
| 4,319,135 | 3/1982 | Steinhage | 250/332 |
| 5,077,474 | 12/1991 | Nix et al. | 250/332 |
| 5,095,211 | 5/1992 | Kimata . | |
| 5,369,280 | 11/1994 | Liddiard | 250/338.4 |

OTHER PUBLICATIONS

Ttomita, et al, ITEJ Technical Report, vol. 13, 1989 (pp. 7–12).

"Status of Uncooled Infrared Imagers", Robert E. Flannery and James E. Miller, CECOM Night Vision and Electro–Optics Directorate, Infrared Technology Division, Ft. Belvoir VA, SPIE vol. 1689 Infrared Imaging Systems (1992)/379.

"Ferroelectric Ceramics for Infrared Detection", R. Watton and M. A. Todd, Royal Signals and Radar Establishment, Great Malvern, Worcs. U.K., Br. Ceram. Proc., No. 41, 205–217 1989).

*Primary Examiner*—Davis L. Willis
*Assistant Examiner*—Richard Hanig
*Attorney, Agent, or Firm*—Burns, Doane, Swecker & Mathis

[57] ABSTRACT

A thermal-type infrared detecting element is provided which includes an infrared detecting member, a support member supporting the infrared detecting member, a substrate holding the support member, and a low thermal conduction part intervening between the substrate and a central portion of the support member, the support member having a link portion in at least a peripheral portion thereof which links the support member to the substrate and slits and/or grooves defined at a location adjacent the link portion. This infrared detecting element exhibits excellent sensitivity and responsiveness while requiring no cooling, and a one- or two-dimensional array of the element assures clear imaging with less crosstalk.

18 Claims, 15 Drawing Sheets

INFRARED DETECTING ELEMENT

BACKGROUND OF THE INVENTION

The present invention relates to infrared detecting elements adapted to detect infrared rays utilizing a change in physical properties thereof due to heat such as pyroelectricity, change in resistance with varying temperature or thermoelectromotive force. More particularly, it relates to an infrared detecting element which assures a substantial rise in temperature in response to incident infrared rays of a very small thermal responsiveness with less crosstalk, and which is suitable quantity and offers excellent sensitivity and for high integration and is used solely or in an array arrangement.

Conventional infrared detecting elements include quantum detectors and thermal detectors. The quantum detectors include one utilizing photoconduction, one utilizing photovoltaic effect and the like, and generally offer excellent responsiveness and sensitivity. However, they must be cooled to temperatures lower than the temperature of liquid nitrogen (77 K.) for use and, hence, the major disadvantages thereof include difficulties in downscaling and handling and their high price. By contrast, the thermal detectors include one utilizing pyroelectricity, one utilizing a change in resistance with varying temperature, one utilizing thermoelectromotive force, and the like, and generally offer less sensitivity and responsiveness than the quantum detectors. Nevertheless, they offer great advantages in that they need no cooling, allow downscaling and lightening and offer a low price.

Objectives common to these thermal detectors in enhancing the sensitivity thereof include:

(1) to make the detection part exhibit a large rise in temperature in response to incident infrared rays of a very small thermal quantity, i.e., to reduce the thermal capacity of the detection part;

(2) to reduce thermal leakage due to thermal conduction from the detection part to its peripheral portions;

(3) to reduce heat conduction from the element in operation to elements adjacent thereto if the thermal detector is in an array arrangement;

(4) to form the detection part integrally with a signal processing system and;

(5) to make the array of elements have a sufficient strength.

Of the thermal detectors, the pyroelectric-type element is considered to offer the highest sensitivity and has been put into practical use in some forms of two-dimensional array detector. A pyroelectric-type, two-dimensional array detector described in, for example, "Bulletin of Ceramic Process", Vol. 41, 1989, pp. 205 to 217, is fabricated by mechanically polishing a pyroelectric ceramic wafer to a thickness of several tens μm and forming grooves into the wafer by ion milling for thermal isolation of individual detection parts. Top electrodes of the detection parts of this detector is connected to a signal processing circuit by means of a metallic bump to achieve electrical connection therebetween.

On the other hand, a pyroelectric-type, two-dimensional array detector described in, for example, "ITEJ Technical is Report", Vol. 13, 1989, p. 7, is fabricated by forming a thin film on an MgO substrate to form detection parts, forming a protective film of polyimide over the resulting surface and completely removing the portion of the MgO substrate lying under the detection parts by etching so as to retain the MgO substrate in the form of a frame lying on the outermost detection part side as supporting the overall array of elements in a bridged fashion. In this detector the elements in each column of the array are connected in series and further electrically connected to an external signal processing circuit at an end portion of the column.

The former detector, however, involves problems in that: (1) there is a limitation in making the ceramic wafer thin, namely, in reducing the thermal capacity of each detection part or the size thereof since the ceramic wafer is machined; (2) high fabrication precision is needed for obtaining stable sensitivity; (3) the use of bump connection causes the productivity to decrease and the mechanical strength of the detector to be lowered; and the like. Similarly, the latter detector suffers problems in that: (1) the complete removal of the substrate under the two-dimensionally arrayed detection parts by etching results in a structure with low strength; only one signal processing circuit is provided to each column of elements, resulting in a disadvantageous signal-to-noise ratio; (3) in association with the low mechanical strength, the detection parts are likely to vibrate, so that the noise based on the piezoelectric property of the pyroelectric material is likely to occur; and the like.

It is, therefore, an object of the present invention to overcome the foregoing problems and to provide a thermal-type infrared detecting element having a thin film detecting part with less thermal capacity and less thermal conduction to peripheral portions and a method for fabricating the same.

Another object of the present invention is to provide a thermal-type infrared detector apparatus with less crosstalk wherein detecting elements of the same type as above are arranged in an array.

A further object of the present invention is to provide a thermal-type infrared detector apparatus wherein the detection part and a signal processing circuit are integrally formed.

SUMMARY OF THE INVENTION

According to one aspect of the present invention, there is provided an infrared detecting element comprising an infrared detecting member, a support member supporting the infrared detecting member, a substrate holding the support member, and a low thermal conduction part intervening between the substrate and a central portion of the support member, the support member having a link portion in at least a peripheral portion thereof which links the support member to the substrate and slits and/or grooves formed at a location adjacent the link portion.

Preferably, the low thermal conduction part comprises a cavity portion provided between the support member and the substrate.

Alternatively, the low thermal conduction part comprises a porous member provided between the support member and the substrate.

In the infrared detecting element of the present invention, preferably, the slits or the grooves each have a difference in width between one end and the other end thereof, whereby each slit or groove extends in an increased area and hence can also serve as an opening for etching.

Preferably, the slits or grooves are discretely defined along the peripheral edge of the support member for preventing thermal conduction to the surrounding substrate.

Further preferably, the slits or grooves define at least two circuits along the peripheral edge of the support member, the slits or grooves in the inner circuit are located as covering portions intervening between the slits or grooves in the outer circuit.

In addition, the slits or grooves may overlap mutually.

According to another aspect of the inventin, there is provided an infrared detecting present element comprising a substrate, a porous member having a low thermal conductance and disposed on the substrate, a support member formed of a thin insulator film and disposed on the porous member, and an infrared detecting member disposed on a surface of the support member.

According to yet another aspect of the present invention, there is provided a method for fabricating an infrared detecting element including a substrate, a low thermal conduction part disposed on a surface of the substrate, a support member disposed on the low thermal conduction part and an infrared detecting member disposed on a surface of the support member, the method comprising the steps of:

defining a concave portion into the substrate at a location where the infrared detecting member is to be formed;

filling the concave portion with an easy-to-etch material made of a material to be easily etched or a material to be easily etched while retaining a porous skeleton having a low thermal conductivity;

sequentially stacking the support member and the infrared detecting member on the easy-to-etch material, followed by patterning; and etching the easy-to-etch material to define a cavity portion or to form a porous member.

According to yet another aspect of the present invention, there is provided a method for fabricating an infrared detecting element including a substrate, a low thermal conduction part disposed on a surface of the substrate, a support member disposed on the low thermal conduction part and an infrared detecting member disposed on a surface of the support member, the method comprising the steps of:

forming a convex portion on a surface of the substrate at a location where the infrared detecting member is to be formed, the convex portion being formed of an easy-to-etch material made of a material to be easily etched or a material to be easily etched while retaining a porous skeleton having a low thermal conductance;

sequentially stacking the support member and the infrared detecting member on the substrate including the convex portion, followed by patterning; and etching the convex portion to define a cavity portion or to form a porous member.

According to still yet another aspect of the present invention, there is provided a method for fabricating an infrared detecting element including a substrate, a low thermal conduction part disposed on a surface of the substrate, a support member disposed on the low thermal conduction part and an infrared detecting member disposed on a surface of the support member, the method comprising the steps of:

forming a spacer on a surface of the substrate at a location where the infrared detecting member is to be formed, the spacer being formed of an easy-to-etch material made of a material to be easily etched or a material to be easily etched while retaining a porous skeleton having a low thermal conductance;

forming an intermediate layer made of a material hard to etch having a high thermal conductance on a surface of the substrate at a location where the infrared detecting element is not to be formed;

sequentially stacking the support member and the infrared detecting member on the spacer, followed by patterning; and etching the spacer to define a cavity portion or to form a porous member.

According to a further aspect of the present invention, there is provided a method for fabricating an infrared detecting element comprising the steps of:

stacking on a substrate a support member and an infrared detecting member, followed by patterning;

etching a spacer provided between the substrate and the support member or a surface of the substrate lying under the support member to define a cavity portion between the support member and the substrate; and filling the cavity portion with a porous member forming material, followed by a post-treatment to form a porous member.

According to a yet further aspect of the present invention, there is provided an infrared detecting element comprising a signal processing circuit part formed in a superficial portion of a semiconductor substrate, a support member formed of a thin insulator film and disposed above the signal processing circuit part with intervention of a cavity portion between the support member and the signal processing circuit part, and an infrared detecting member disposed on a surface of the support member.

According to a still further aspect of the present invention, there is provided an infrared detector apparatus comprising infrared detecting elements of the type same as any one of the foregoing infrared detecting elements which are arranged one- or two-dimensionally.

According to a yet still further aspect of the present invention, there is provided an infrared detector apparatus comprising an infrared detecting element section having the aforesaid infrared detecting elements, and a sealing container accommodating the infrared detecting element section and provided, at its inside, with a vacuum, a reduced pressure atmosphere or a low thermal conduction gas atmosphere.

The infrared detecting element of the present invention includes the low thermal conduction part which comprises a cavity defined by, for example, any one of various etching techniques and provided with a vacuum therein or filled with any gas such as air, or which comprises a porous material having a multiplicity of pores instead of the cavity. With this construction, thermal of a very small thermal quantity generated at the detection part due to incident infrared rays is prevented from escaping from the support member to the underlying substrate through the link portion lying therebetween due to thermal conduction.

Further, the infrared detecting element of the present invention includes at least one link portion linking the detection part to the surrounding portion and the grooves and/or slits for thermal isolation extending as crossing the straight line defined between the junction point of the link portion and the center of the detection part. Such construction assures a lengthened thermal conduction path or a virtually lengthened heat conduction path and hence an increased thermal conduction resistance, thereby impeding the thermal conduction. Accordingly, only the thermal conduction resistance of the infrared detecting element can be increased without reducing the effective area of the detection part.

In the infrared detecting element of the present invention, where the cavity portion underlying the detection part is filled with a porous member having a good thermal insulating characteristic, the porous member serves to suppress the thermal conduction to the substrate while supporting the detection part, thereby improving the mechanical strength of the link portion between the support member and the surrounding portion.

In the infrared detector apparatus of the present invention, a signal processing circuit part is formed adjacent each infrared detecting element on the same substrate so as to be integrated therewith. This leads to an infrared detector apparatus with lessened noise and improved sensitivity.

In the method for fabricating an infrared detecting element according to the present invention, the infrared detecting member is stacked on the easy-to-etch material and then the easy-to-etch material is etched to define a cavity portion or to form a porous member, thereby forming the low thermal conduction part which provides a desired space between the substrate and the detecting member and is formed of a material different from the substrate.

DETAILED DESCRIPTION

A thermal-type, infrared detecting element according to the present invention is designed to include an infrared detection part having a reduced thermal capacity, so that the heat received will efficiently contribute to a temperature rise at an infrared detecting member. In addition the element is designed to have an increased thermal conduction resistance of the portion between the infrared detecting member and the substrate so as not to permit the received heat to escape.

Specifically, as the means for reducing the thermal capacity of the detection part a low thermal conduction part is provided intermediate between the support member supporting the infrared detecting member and the substrate, and further, to increase the thermal conduction resistance of the portion intermediate between the infrared detecting member and the substrate, slits or grooves are provided in the periphery of the support member, particularly in a portion adjacent the link portion linking the support member to the substrate.

The slits or grooves in the periphery of the support member serve to inhibit the heat absorbed by the infrared detection part from escaping toward the substrate through the support member. It is particularly preferable to provide the slits or grooves in a link portion 11 linking the support member 2 to the substrate as shown in, for example, FIG. 1(a) since the thermal conduction path defined from the central portion of the support member 2 to the link portion 11 is cut off thereby, so that the heat conducts while making a detour around the slits or grooves 9.

Since the support member 2 is formed of a thin insulator film such as made of $SiO_2$ or $SiN_4$ having a thickness of about 1000 to about 2000 Å, the slits extending vertically through the support member 2 are more preferable than the groove for the sake of easy fabrication and for the formation of an opening for etching against the substrate, as will be described later. Nevertheless, the grooves not extending vertically through the support member serve the purpose since the retained portion in each groove is very thin, which contributes to the cutting-off of the thermal conduction path. In addition to these slits or grooves, it is preferable to provide an etching hole 10 for etching the substrate and an easy-to-etch material to be described later.

Figure 11:
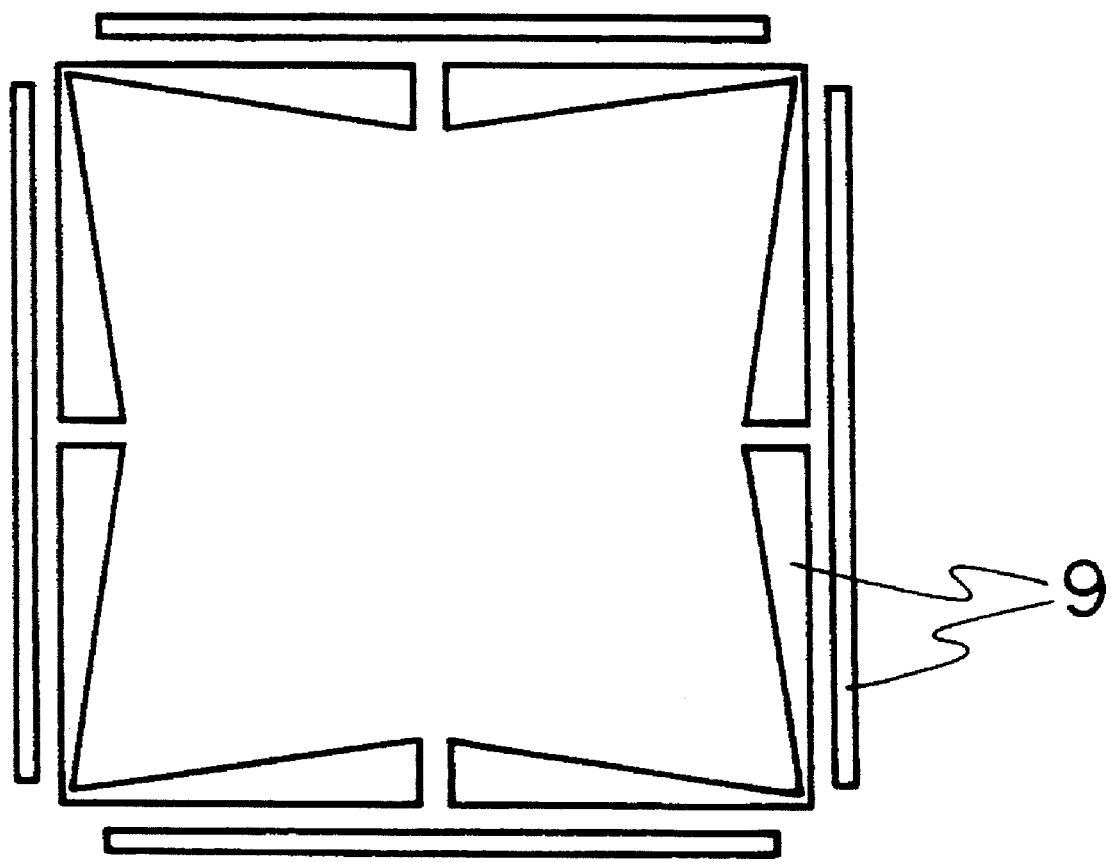
FIG. 11 is a schematic illustration showing the shape of a slit or groove.
Figure 12:
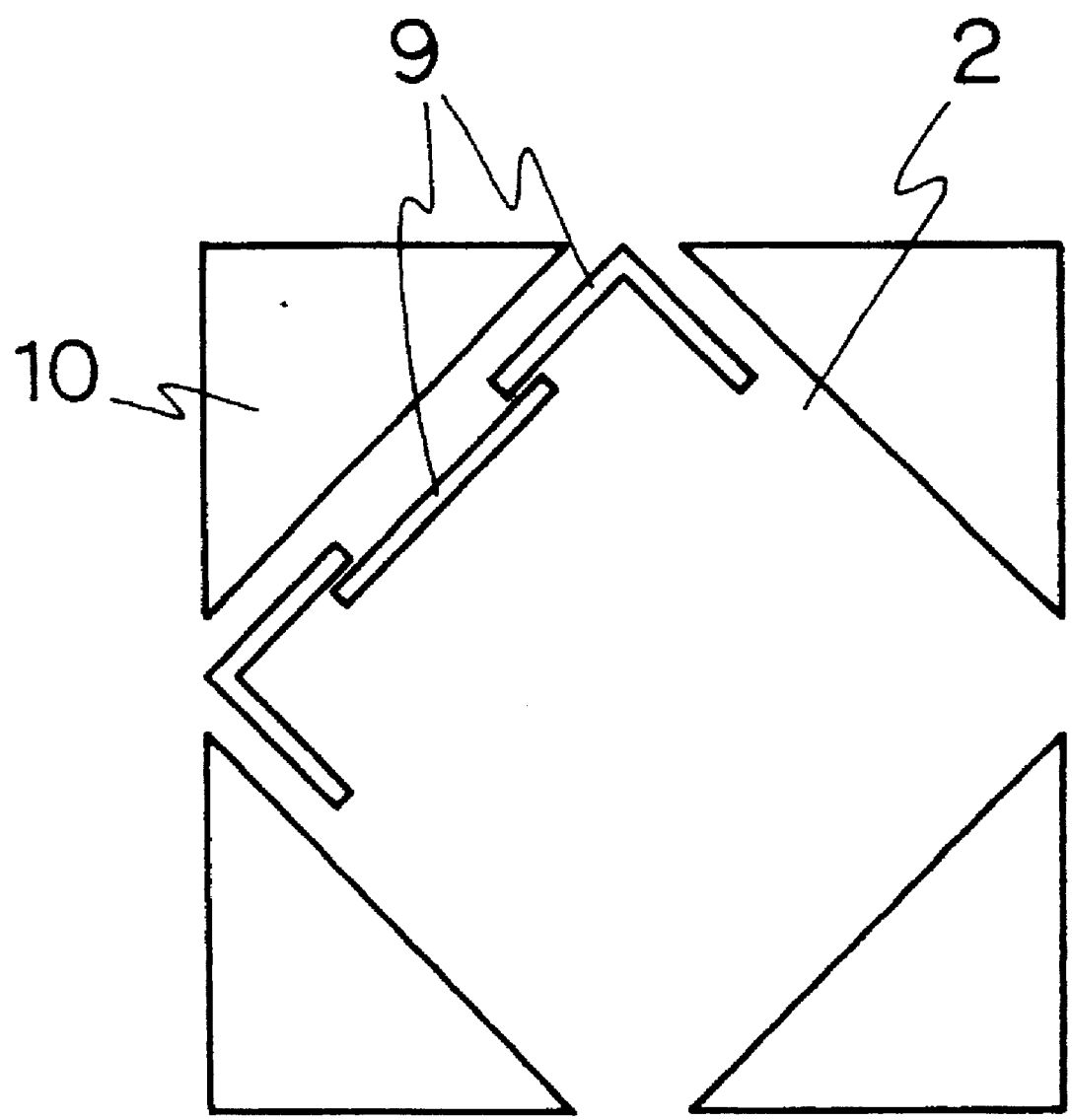
FIG. 12 is a schematic illustration showing the shape of another slit or groove.
Figure 13:
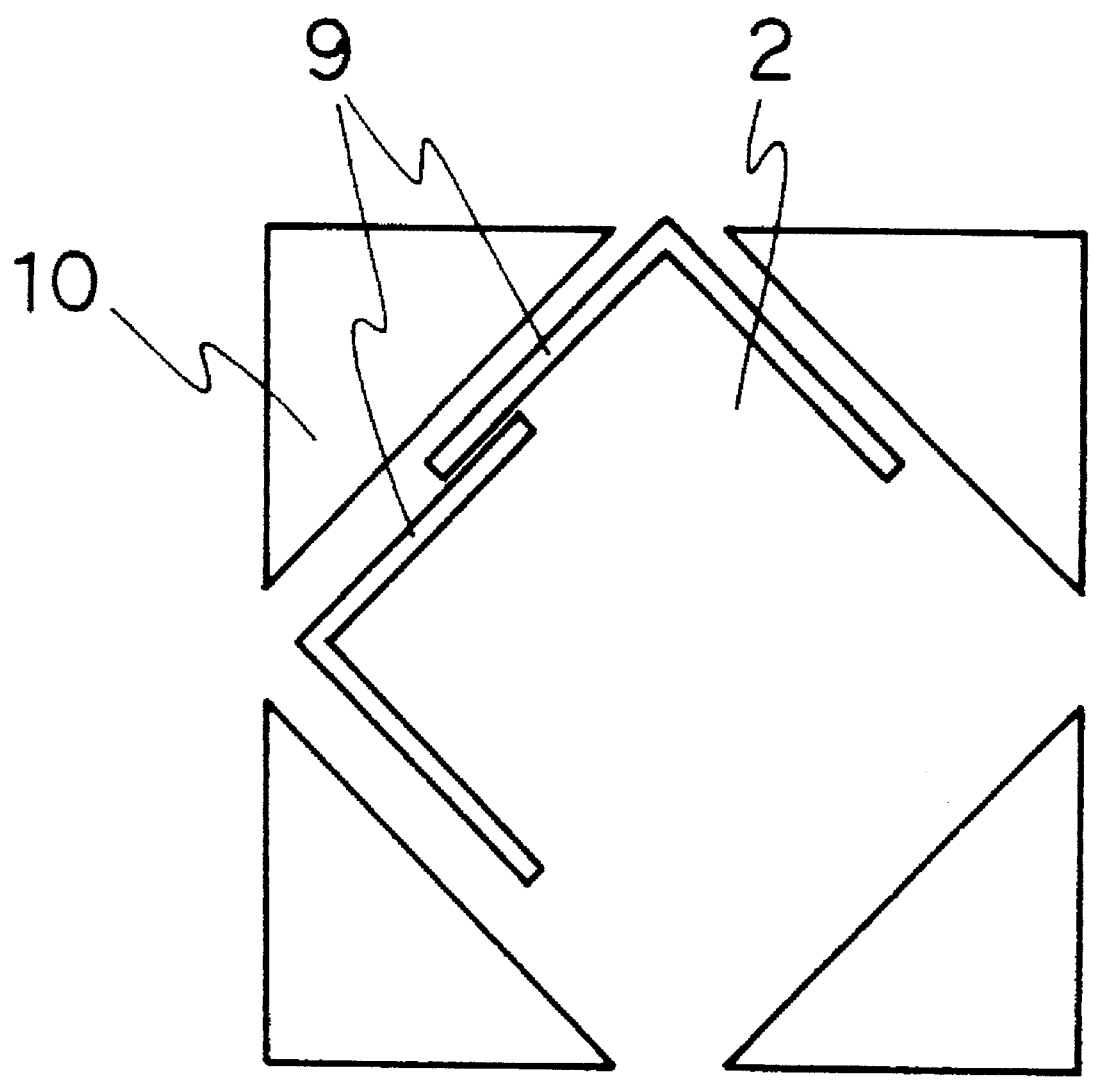
FIG. 13 is a schematic illustration showing the shape of yet another slit or groove.

FIGS. 11 to 13 each illustrate another example of the shape of the slits or grooves though only partially. The slits or grooves 9 shown in FIG. 11 each have end portions different in width. For example, each slit or groove is shaped into a large triangle so as to serve also as the opening for etching.

The slits or grooves 9 shown in FIG. 12 define two circuits along the peripheral edge of the support member 2 in such a manner that the slits or grooves in the inner circuit cover the portions intervening between the discrete slits or grooves in the outer circuit. Thus, the thermal conduction is cut off more efficiently.

Further, the slits or grooves 9 shown in FIG. 13 are not aligned in the same line and alternately overlap each other at end portions thereof. In this way the thermal is efficiently prevented from escaping from the end portions of the slits or grooves.

Figure 1A:
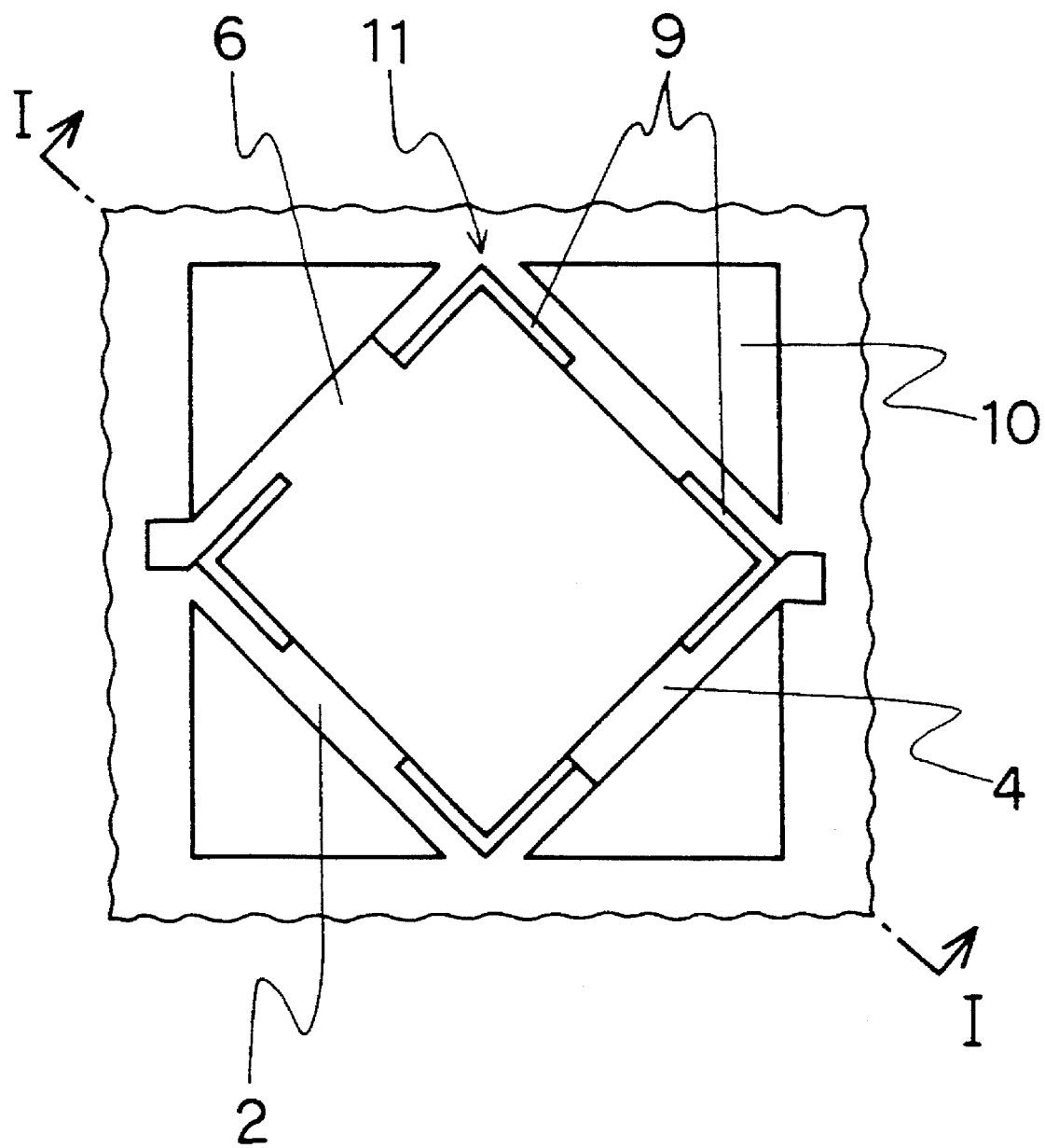
FIG. 1(a) and FIG. 1(b) are, respectively, an explanatory plan view and an explanatory sectional view, both of which show one embodiment of an infrared detecting element according to the present invention.
Figure 1B:
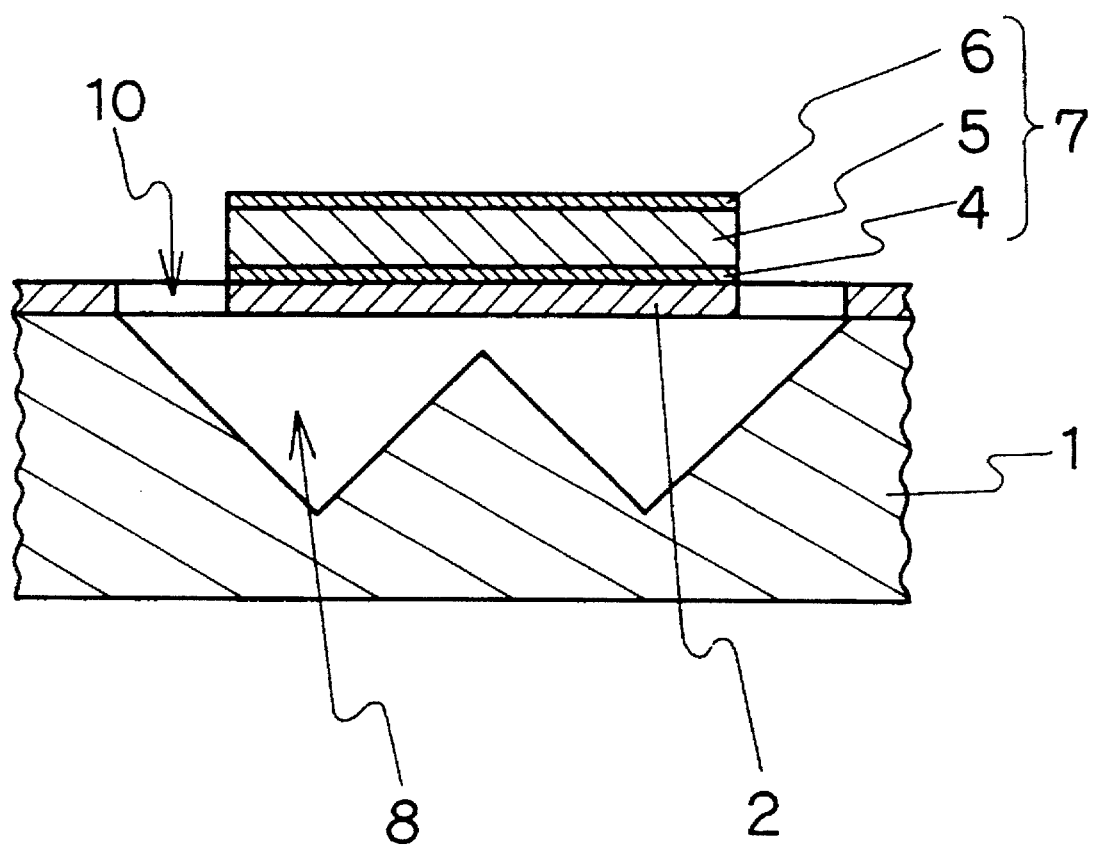
Figure 5A:
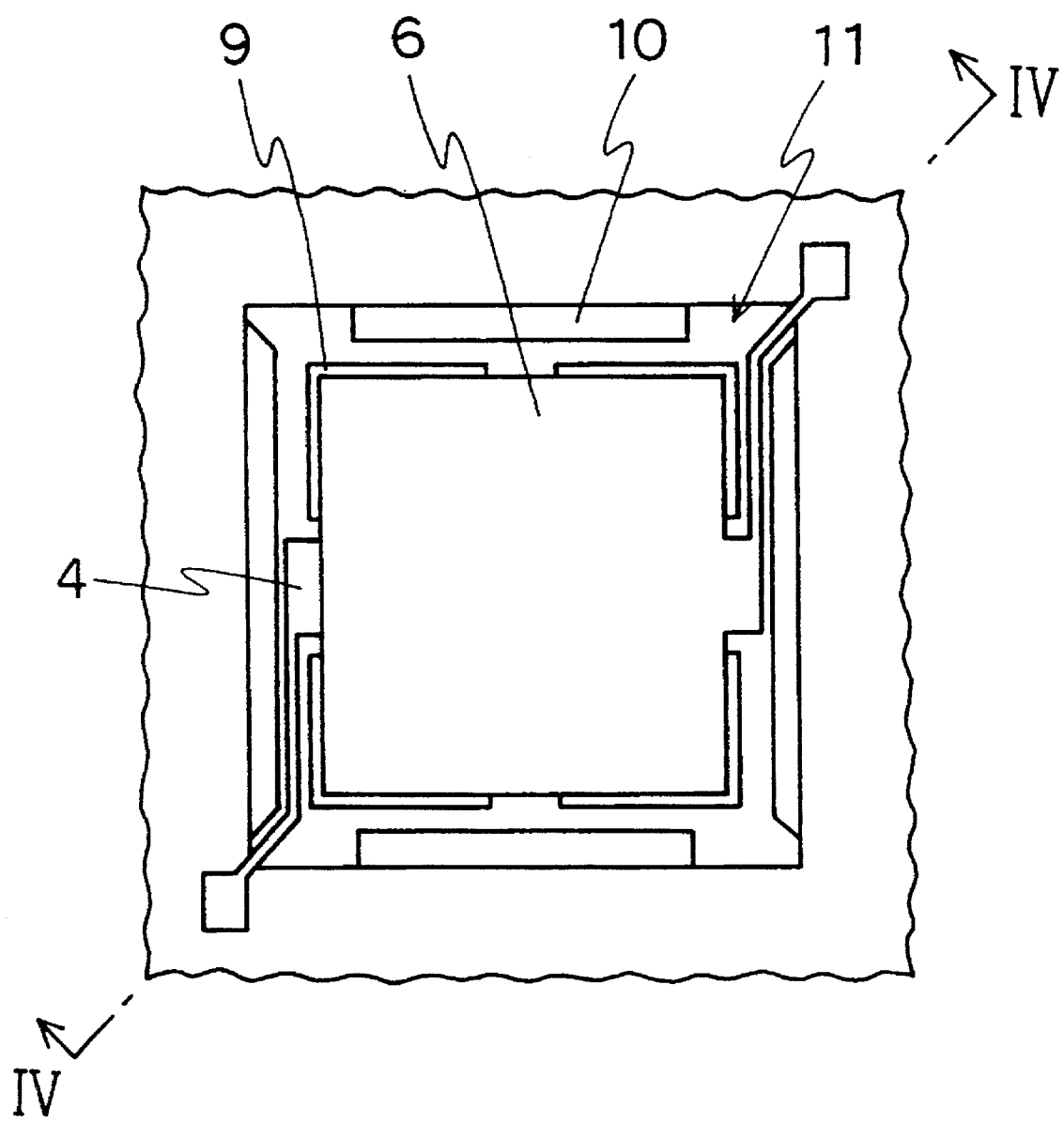
FIGS. 5(a) and 5(b) are, respectively, an explanatory plan view and an explanatory sectional view of another embodiment of an infrared detecting element according to the present invention.
Figure 5B:
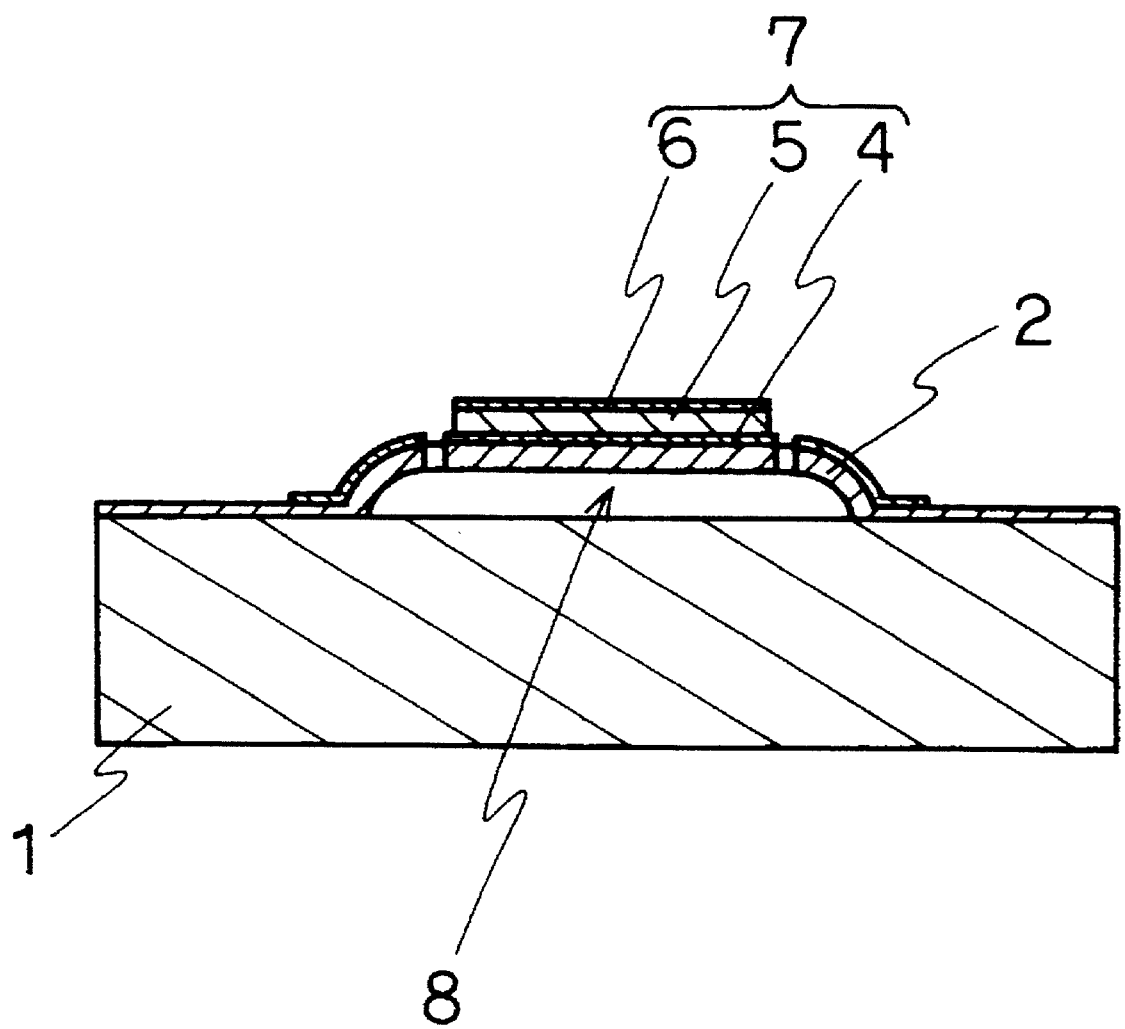
Figure 9:
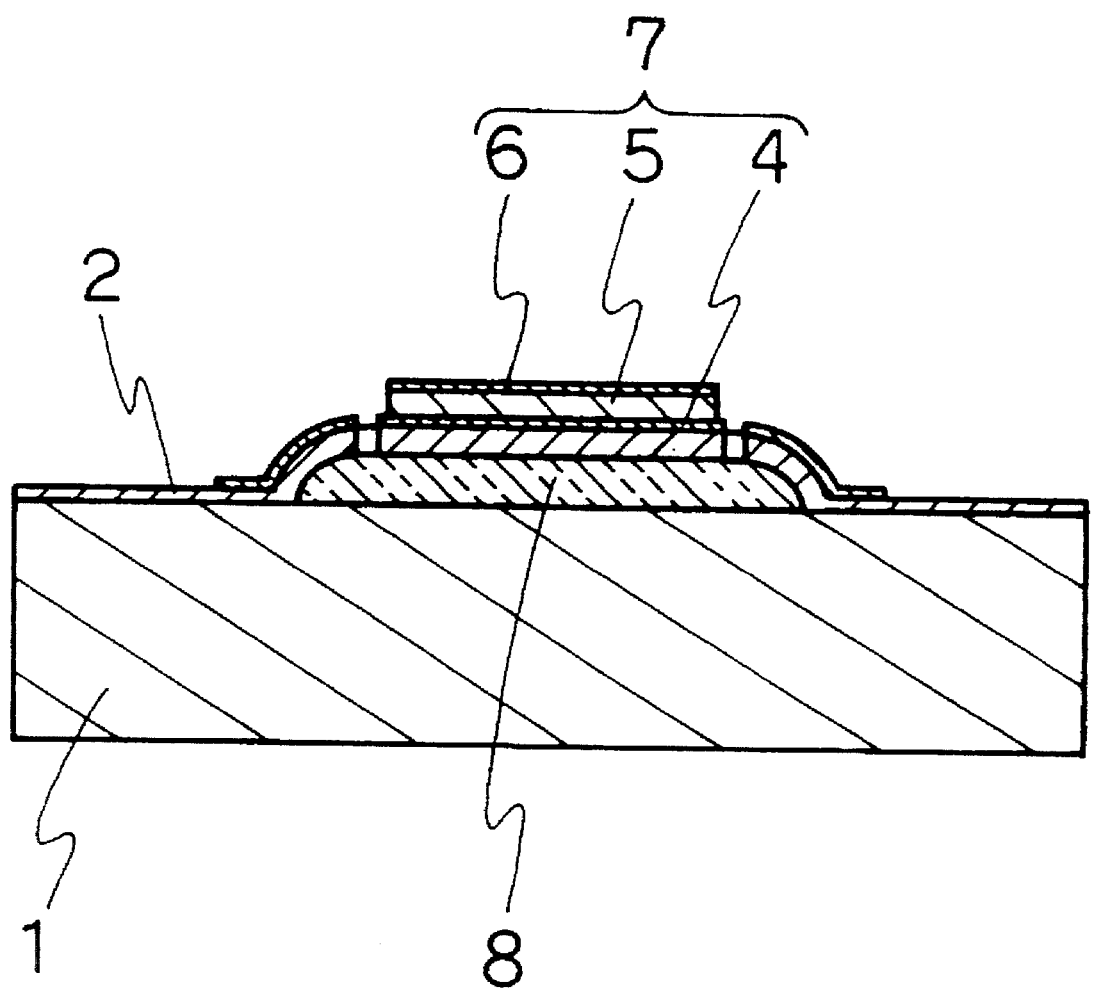
FIG. 9 is an explanatory sectional view of yet another embodiment of an infrared detecting element according to the present invention.

As shown in, for example, FIG. 1(b) or FIG. 5(b), low thermal conduction part 8 is formed by defining a cavity portion in the substrate 1 at a location under the support member 2 or forming the support member 2 above the substrate 1 with an intervening cavity portion or, as shown in FIG. 9, interposing a porous member made of a material having a low thermal conductance between the support member 2 and the substrate 1. Note that FIG. 1(b) is a sectional view taken along with a line I—I of FIG. 1(a), and FIG. 5(b) is a sectional view taken along with a line IV—IV of FIG. 5(a).

The provision of the cavity portion between the support member and the substrate makes it possible to efficiently inhibit thermal conduction since air in the cavity portion has a very low thermal conductance and hence allows poor thermal conduction.

Alternatively, the provision of the porous member made of a low thermal conduction material such as glass or an oxide between the support member and the substrate makes it possible to inhibit heat from escaping by virtue of air existing in the pores while supporting the support member on the substrate to assure a high mechanical strength.

The embodiments having the cavity portion or the porous member will be specifically described later. The cavity portion or porous member is formed by, for example etching the substrate at a location under the support member after the formation of the infrared detection part, or filling a concave portion previously provided into the substrate with an easy-to-etch material or forming a convex portion of the easy-to-etch material on the substrate; stacking the support member and the infrared detecting member, followed by patterning; and removing the easy-to-etch material by etching. Any material having a high selective etching ratio to the substrate is herein usable as the easy-to-etch material. For instance, where the support member is made of $SiO_2$ or $Si_3N_4$ film and the substrate is of silicon, the easy-to-etch material is formed of glass, polycrystalline silicon or the like, otherwise where the substrate is made of GaAs, the easy-to-etch material is made of $Al_xGa_{1-x}As$ or the like.

Alternatively, the material capable of being porously etched is used to form the porous member instead of complete removal thereof. Such porous member is formed by heat treating the material formed of, for example, $Na_2O$—$B_2O_3$—$SiO_2$ glass at about 500° C. to separate into $Na_2O$—$B_2O_3$ phase and $SiO_2$ phase and etching the glass with diluted hydrochloric acid to afford a porous material with only the $Na_2O$—$B_2O_3$ phase removed. As a substitute for the $Na_2O$—$B_2O_3$—$SiO_2$ glass can be used $NR_2O$—$B_2O_3$—$SiO_2$—$Al_2O_3$ glass, $Na_2O$—$B_2O_3$—$SiO$—$NiO$ glass, $Na_2O$—$B_2O_3$—$SiO_2$—$Al_2O_3$—$Fe_2O_3$—$As_2O_3$ glass or the like. In this case the skeleton retained after the etching is preferably made of a material having a low thermal conductance.

Where the easy-to-etch material is filled into the concave portion previously defined into the substrate as described above, there is not there is not necessarily conducted anisotropic etching against the substrate, and the substrate may be formed of Si other than Si in a specific crystal plane, GaAs, MgO, $SrTiO_3$ or the like.

The porous member may also be formed by forming the cavity portion, filling the cavity portion with a porous member forming material and then rendering the material porous by post-treatment. In this case, examples of the porous member forming material include those affording porous material by heat treatment such as $SiO_2$, $Al_2O_3$, $B_2O_3$ and the like which are formed by sol-gel process, those utilizing hydration such as $3CaO \cdot SiO_2$, and those utilizing sintering such as alumina silicate ceramics, alumina ceramics, diatomaceous earth ceramics and zeolite ceramics.

Upper and lower electrode films and a pyroelectric film are formed by known process such as physical or chemical vapor phase synthesis, sol-gel process or electrophoresis. These processes enable a precise formation of a thin film having a thickness of 10 µm or less with ease. Hence, the thermal capacity of the detection part can be reduced to promote the sensitivity to infrared rays, and even an infrared detecting element formed of a film having a large area can be formed with ease. Further, the lift off method is preferably used in such film formation since it allows a hard-to-etch material to be patterned and prevents wet or dry etching from damaging non-etch portions.

Infrared detecting elements of the type described above are arranged one- or two-dimensionally to form an infrared detector apparatus exhibiting good sensitivity. In this case, if the substrate uses a silicon substrate and a signal processing circuit part is formed in the substrate at a location under the infrared detection part, the connection between the infrared detecting element and the signal processing circuit part can easily be achieved, and the resulting detector apparatus can perform a compactly integrated form.

If the infrared detecting element section is held within a sealing container, there can be provided a vacuum, reduced pressure or low thermal conduction gas within the container. This is advantageous in that the thermal radiation from the detection section is alleviated and that frosting is prevented when the detector apparatus is used in a low temperature environment.

Further, where the signal processing circuit part is formed in a separate substrate, it is preferable to connect the signal processing circuit part to respective electrodes of the detecting elements using a bump of a low-melting-point metal since the signal processing circuit part will not be adversely affected even by elevated temperatures needed for the formation of the detection section. In this case, the respective electrodes of the detecting elements is led out onto the reverse side of the substrate and connected to the signal processing circuit part through the bump.

Hereinafter, the present invention will be described in more detail by way of specific examples thereof.

EXAMPLE 1

Figure 2A:
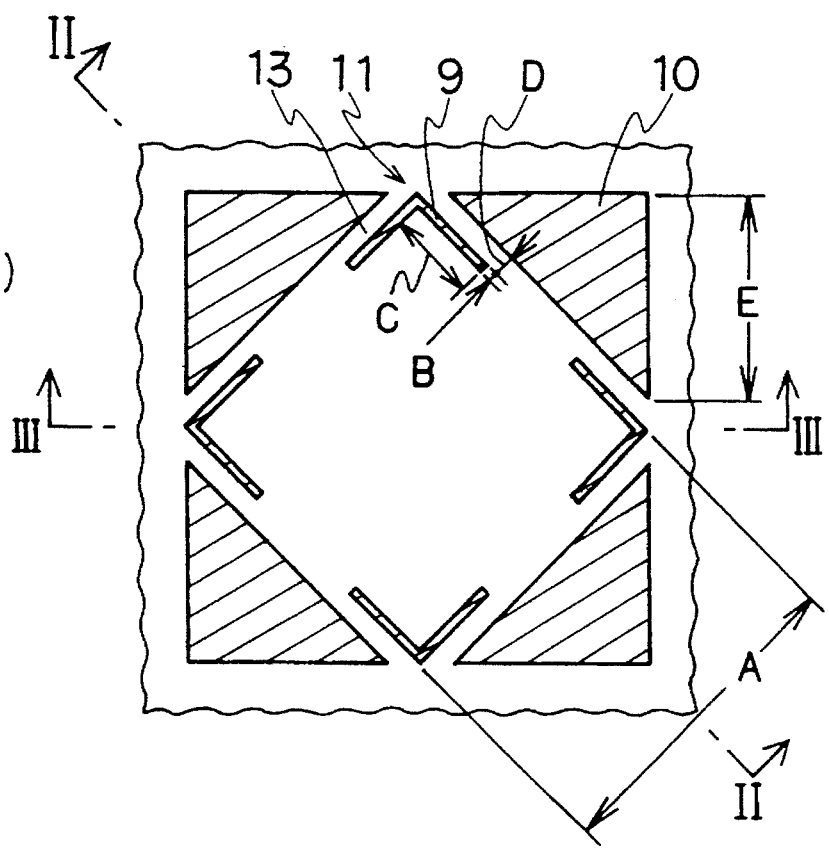
FIGS. 2(a), 2(b) and 2(c) are, respectively an explanatory view for illustrating a fabrication process for one embodiment of an infrared detecting element according to the present invention.
Figure 2B:
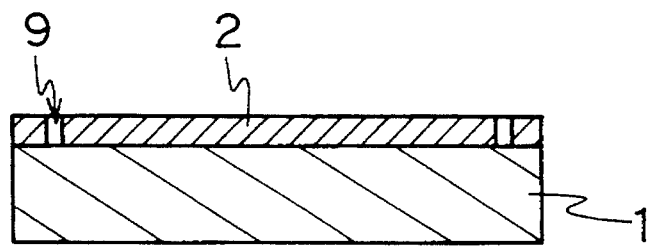
Figure 2C:
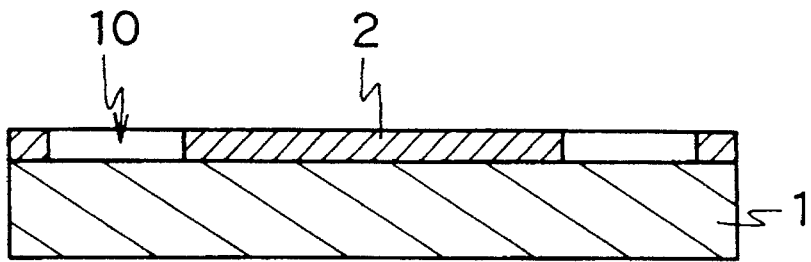

FIGS. 2(a) to 2(c), FIG. 3 and FIG. 4 are explanatory views for illustrating in sequence the process for fabricating one embodiment of the infrared detecting element according to the present invention. FIGS. 2(b) and 2(c) are sectional views taken along with lines III—III and II—II, respectively, of FIG. 2(a).

As shown in FIGS. 2(a) to 2(c), on a surface of an Si (100) substrate 1 was formed an $Si_3N_4$ film having about 2000 Å thickness to serve as a support member 2 by CVD process. Hatched portions of the $Si_3N_4$ film shown in FIG. 2(a) were removed by dry etching according a pattern having triangular etching holes 10 at four corners thereof and hook-like-shaped thermal isolation slits 9 at locations adjacent respective link portions 11 for increasing the thermal conduction resistance. In this case, the length of side A of the central detection part was about 50 µm, the length of side E of each triangular etching hole which was perpendicular to the counterpart side of the hole was about 34 µm, width B of each slit was about 1 µm, the length of side C of each slit 9 was about 10 µm, and the width of thermal conduction path D defined outside each slit 9 was about 2 µm.

Figure 3:
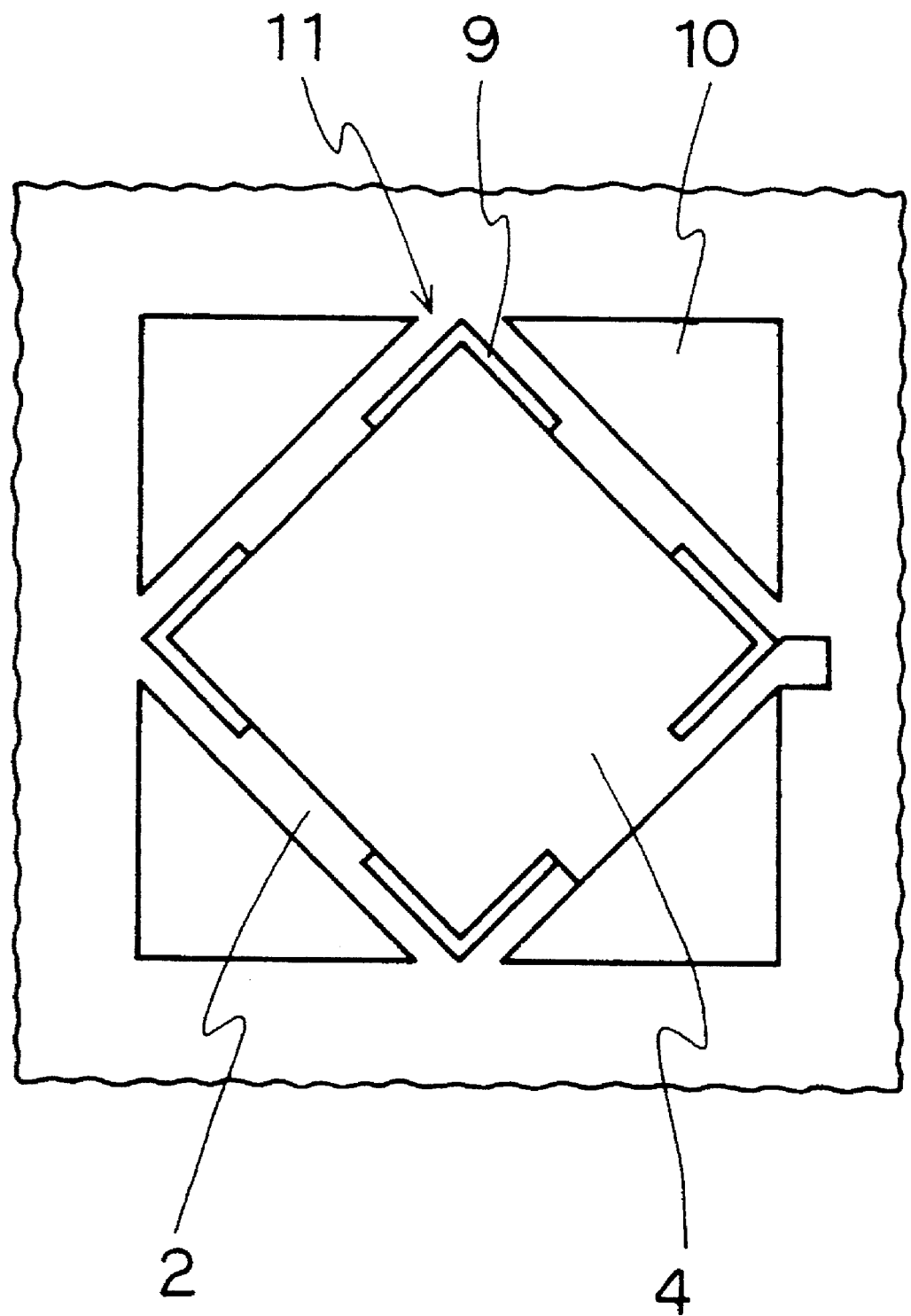
FIG. 3 is an explanatory view for illustrating a fabrication process for one embodiment of an infrared detecting element according to the present invention.

In turn, as shown in FIG. 3, portions other than the portion intended for the formation of a lower electrode 4 were covered with a resist (not shown), and then a Pt film of about 500 Å thickness to serve as the lower electrode 4 was formed over the resulting surface by sputtering. Thereafter, the resist was solved by a solvent such as acetone and ultrasonic application to remove unnecessary Pt film. Thus, the lower electrode 4 as shown in FIG. 3 was formed.

Figure 4:
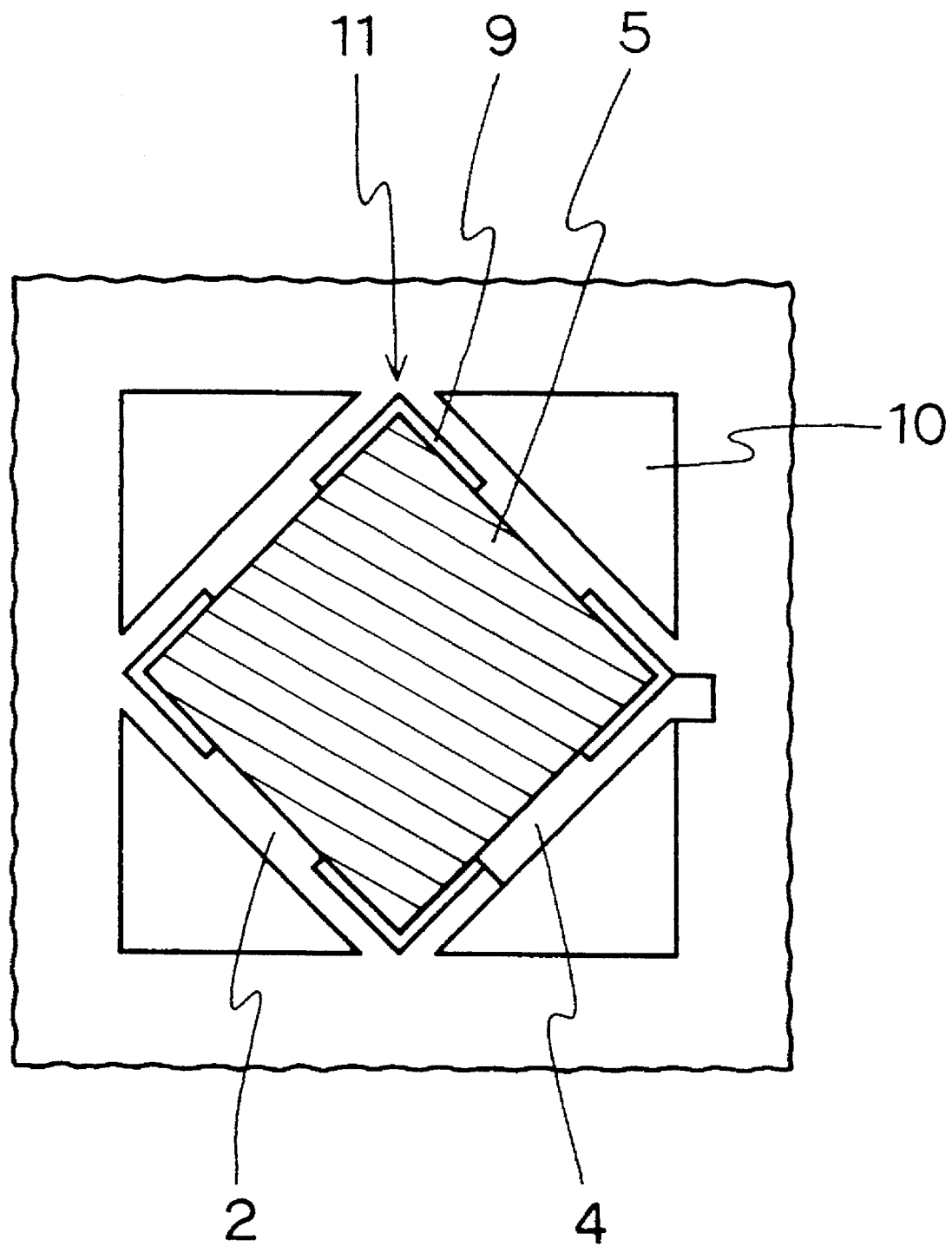
FIG. 4 is an explanatory view for illustrating a fabrication process for one embodiment of an infrared detecting element according to the present invention.

In turn, as shown in FIG. 4, like in the preceding step, portions other than the hatched portion were covered with phosphosilicate glass of about 3 µm thickness. In this case, the phosphosilicate glass functioned like the aforesaid resist. On the resulting surface was formed a pyroelectric film of PZT (Pb—Zr—Ti—O) to about 2 µm thickness by sputtering in a gas (Ar:O$_2$=9:1) at 10 mTorr with the substrate temperature set at about 500° C. or higher. Thereafter, the phosphosilicate glass was removed using hydrofluoric acid to provide a pyroelectric film 5 only in the hatched portion.

Finally, as shown in FIG. 1(a), the resulting surface except for the portion intended for the formation of an upper electrode was covered with a resist (not shown), and then an Ni—Cr film (not shown) serving as both the upper electrode and an infrared absorption layer was deposited to about 1000 Å thickness on the resulting surface by sputtering. Further, the resist layer was removed using a solvent to form the structure of an infrared detecting member wherein the pyroelectric film 5 was sandwiched between the upper and lower electrodes 4 and 6 as shown in FIG. 1(b). In turn, the Si substrate 1 was etched in a portion thereof underlying the thus constructed structure mainly through the triangular etching holes 10 using 30% KOH at 70° C. Because of Si (100) plane very easy to etch compared with Si (111) plane, the substrate was etched through the triangular etching holes 10 defined in the support member 2 to form cavities in reversed pyramid form. This etching progressed at a location under the Si$_3$N$_4$ support member 2 having the structure of infrared detecting member 7 thereon to form four cavities in reversed pyramid form which were arranged in a matrix fashion in the substrate 1. By allowing the etching to further progress, a low thermal conduction part 8 was formed under the infrared detecting member 7 as comprising a cavity in which an Si ridge shaped like cross with slopes was retained centrally, resulting in the support member 2 lifted as if floating (refer to FIG. 1(b)). The procedure thus described afforded an infrared detecting element of the structure comprising the support member 2 of Si$_3$N$_4$, lower electrode 4, pyroelectric film 5 and upper electrode 6 as shown in FIGS. 1(a) and 1(b).

The infrared detecting element thus fabricated was electrically connected to an external signal processing circuit through upper and lower leads extending from the infrared detecting element to form an infrared detector apparatus. By employing such arrangement, heat derived from infrared rays incident on the detection part efficiently caused the temperature of the detection part to rise thereby assuring improved detection sensitivity, since the thermal conduction from the peripheral portion or lower portion of the detection part was suppressed to a very large extent.

EXAMPLE 2

Figure 6A:
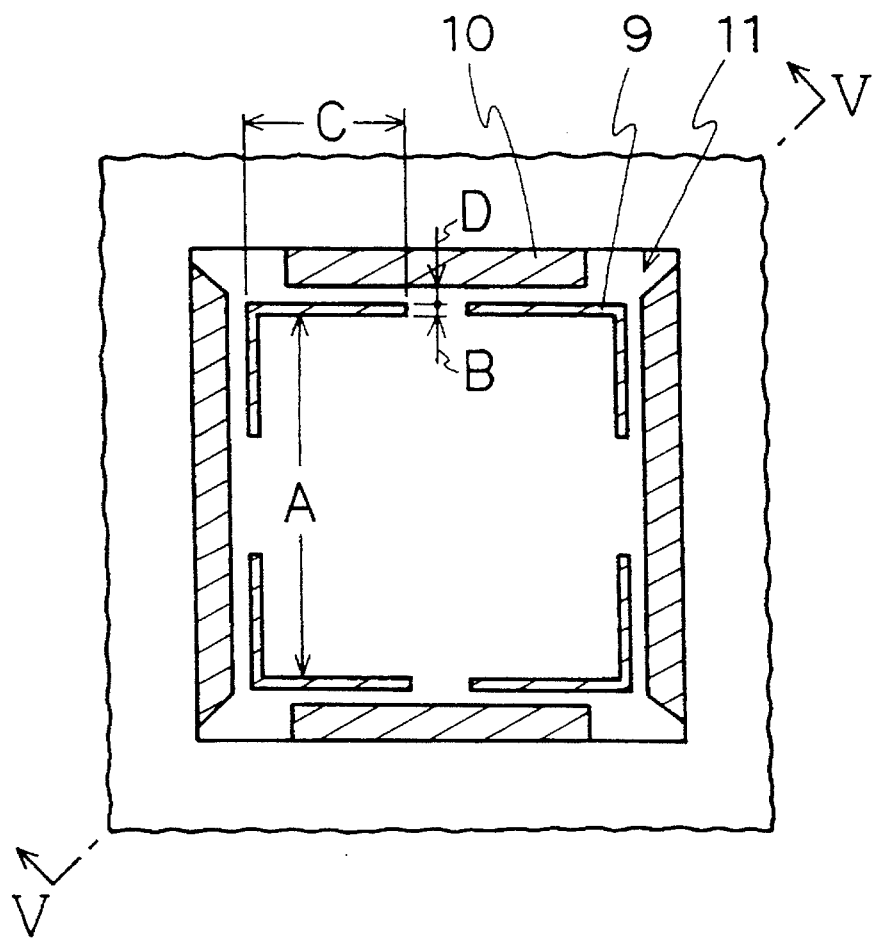
FIGS. 6(a) and 6(b) are, respectively, an explanatory view for illustrating a fabrication process for another embodiment of an infrared detecting element according to the present invention.
Figure 6B:
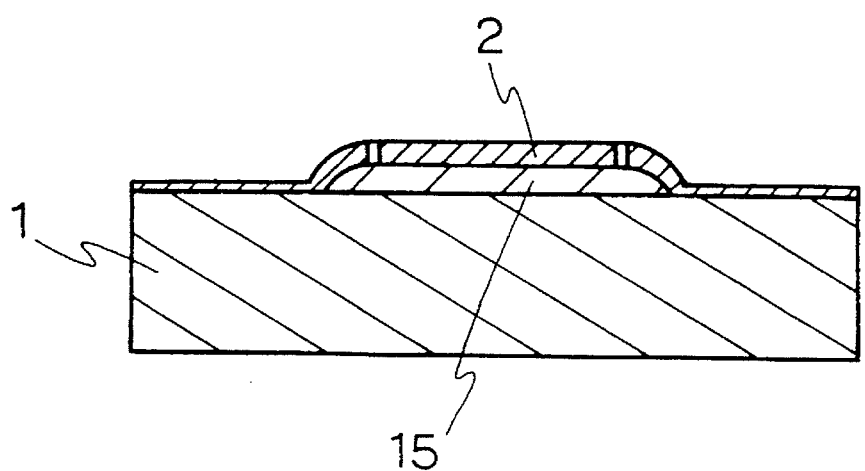

FIGS. 6(a) to 6(b), FIG. 7 and FIG. 8 are explanatory views for illustrating the process for fabricating another embodiment of the infrared detecting element according to the present invention. FIG. 6(b) is sectional view taken along line V—V of FIG. 6(a).

As shown in FIGS. 6(a) and 6(b), on a surface of an Si substrate 1 was formed an easy-to-etch material layer made of phosphosilicate glass, which was then patterned to form a spacer 15. On the resulting surface was deposited an Si$_3$N$_4$ film having about 2000 Å thickness to serve as a support member 2 by CVD process. On a surface of the thus formed Si$_3$N$_4$ film for the formation of a detection part was formed a phosphosilicate glass layer to about 2 μm thickness, followed by patterning. Further, on the resulting surface was formed an Si$_3$N$_4$ film to about 1000 Å thickness by CVD process. Hatched portions of the Si$_3$N$_4$ film shown in FIG. 6 were removed by dry etching according a pattern having etching holes 10 and hook-like-shaped thermal isolation slits 9 at locations adjacent respective link portions 11 for increasing this the thermal conduction resistance. In case, the length of side A of the central detection part was about 50 μm, width B of each slit was about 1 μm, length C of one side of each slit 9 was about 10 to about 15 μm, and width D of thermal conduction path defined outside each slit 9 was about 2 μm.

Figure 7:
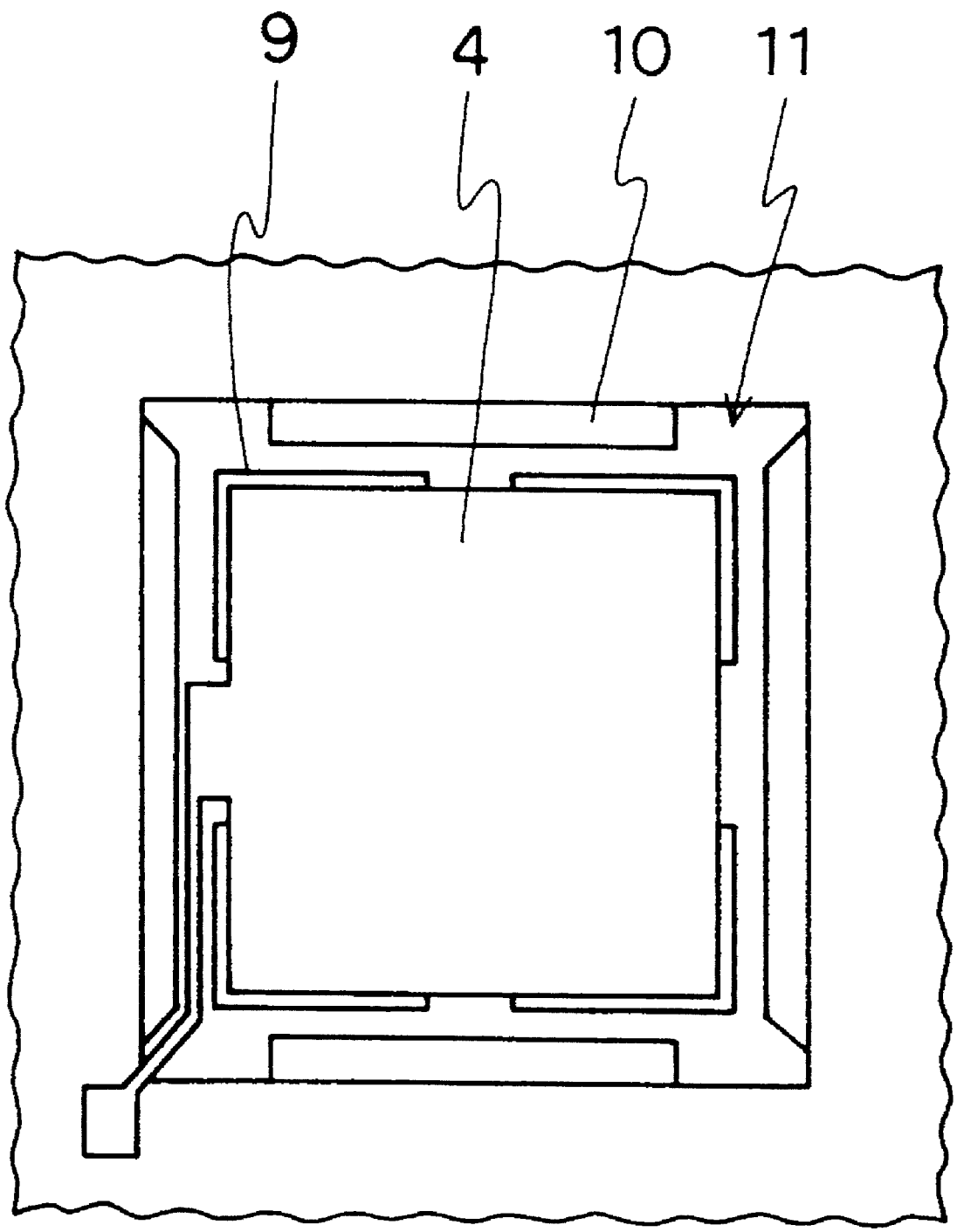
FIG. 7 is an explanatory view for illustrating a fabrication process for another embodiment of an infrared detecting element according to the present invention.

In turn, as shown in FIG. 7, portions other than the portion intended for the formation of a lower electrode 4 were covered with a resist (not shown), and then a Pt film of about 1000 Å thickness to serve as the lower electrode 4 was formed over the resulting surface by sputtering. Thereafter, the resist was solved by a solvent such as acetone and ultrasonic application to remove unnecessary Pt film. Thus, the lower electrode 4 as shown in FIG. 7 was formed.

Figure 8:
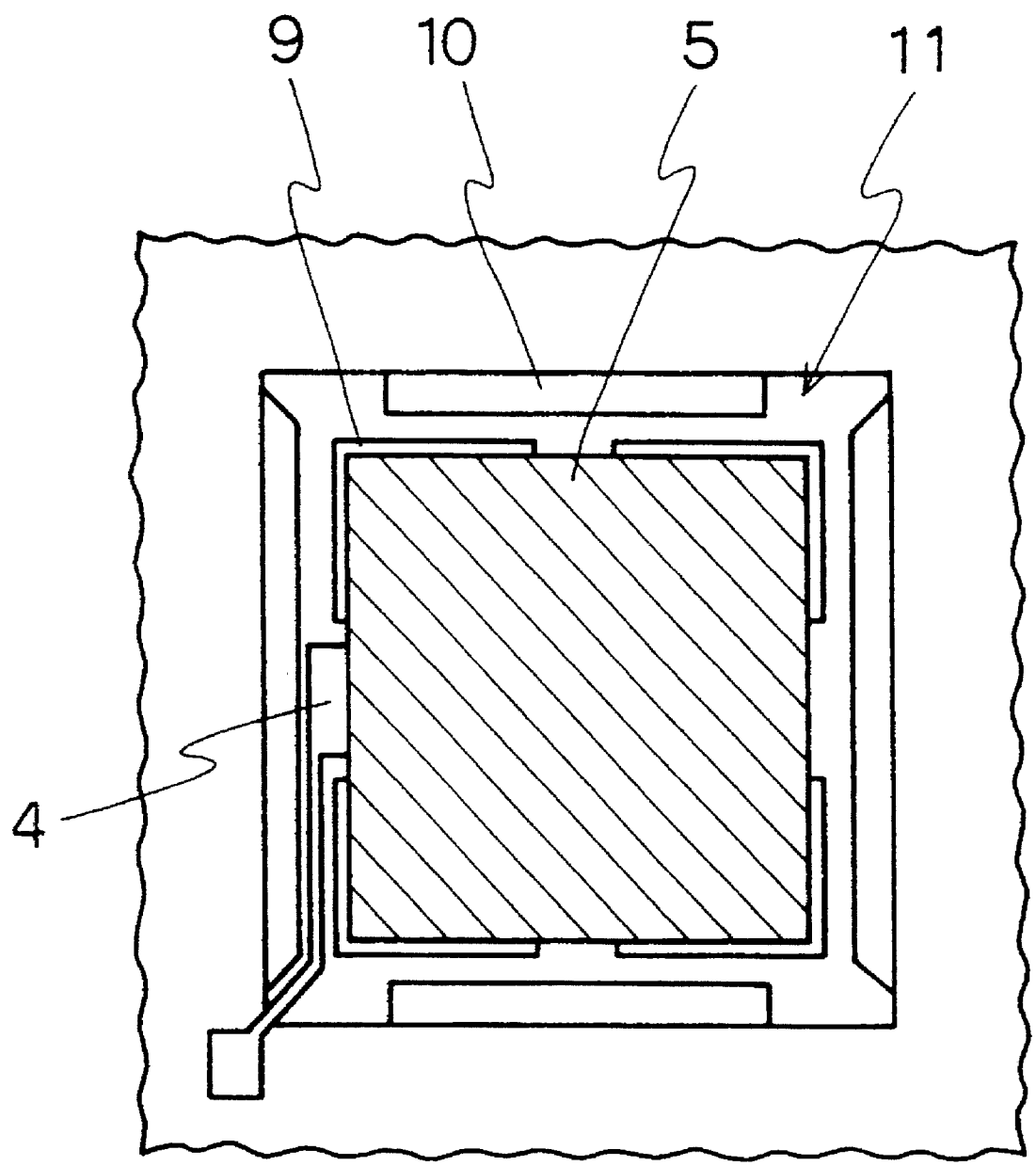
FIG. 8 is an explanatory view for illustrating a fabrication process for another embodiment of an infrared detecting element according to the present invention.

In turn, as shown in FIG. 8, like in the preceding step, portions other than the hatched portion were covered with phosphosilicate glass of about 3 μm thickness. On the resulting surface was formed a pyroelectric film of PZT (Pb—Zr—Ti—O) to about 2 μm thickness by sputtering in a gas (Ar:O$_2$=9:1) at 10 mTorr with the substrate temperature set at about 500° C. or higher. Thereafter, the upper phosphosilicate glass layer was removed using hydrofluoric acid to provide a pyroelectric film 5 only in the hatched portion.

Further, as shown in FIG. 5(a), the resulting surface except for the portion intended for the formation of an upper electrode was covered with a resist, and then an Ni—Cr film (not shown) to serve as both the upper electrode 6 and an infrared absorption layer was deposited to about 1000 Å thickness on the resulting surface by sputtering. The resist layer was then removed using a solvent to form the structure of an infrared detecting member wherein the pyroelectric film 5 was interposed between the upper and lower electrodes 4 and 6 as shown in FIGS. 5(a) and 5(b). In turn, the spacer of phosphosilicate glass underlying the thus constructed structure was removed mainly through the rectangular etching holes 10 by etching using hydrofluoric acid. The procedure thus described afforded an infrared detecting element of the structure comprising the support member 2 of Si$_3$N$_4$, lower electrode 4, pyroelectric film 5 and upper electrode 6 as shown in FIGS. 5(a) and 5(b).

The infrared detecting element thus fabricated was electrically connected to an external signal processing circuit through upper and lower leads extending from the infrared detecting element to form an infrared detector apparatus. By employing such arrangement, heat derived from infrared rays incident on the detection part allowed the temperature of the detection part to rise efficiently, thereby assuring improved detection sensitivity, since the thermal conduction from the peripheral portion or lower portion of the detection part was suppressed to a very large extent.

EXAMPLE 3

On a surface of an Si substrate was deposited an Si$_3$N$_4$ film having about 2000 Å thickness to serve as a support member 2 by CVD process. On a surface of the thus formed Si$_3$N$_4$ film for the formation of a detection part was formed a borosilicate glass layer containing 2% or more by weight of Na$_2$O to about 2 μm thickness, followed by patterning. Further, on the resulting surface was formed an Si$_3$N$_4$ film to about 1000 Å thickness by CVD process. Hatched portions of the Si$_3$N$_4$ film as shown in FIGS. 6(a) and 6(b) were removed by dry etching according a pattern defining a central detection part, etching holes 10 and hooked thermal isolation slits 9 located adjacent respective link portions 11 for increasing the thermal conduction resistance. In this case, the length of side A of the central detection part was about 50 μm, width B of each slit was about 1 μm, length C of one side of each slit 9 was about 10 to about 15 μm, and width D of thermal conduction path defined outside each slit 9 was about 2 μm.

In turn, as shown in FIG. 7, portions other than the portion intended for the formation of a lower electrode 4 were covered with a resist, and then a Pt film of about 1000 μm thickness to serve as the lower electrode 4 was formed over the resulting surface by sputtering. Thereafter, the resist was solved by a solvent such as acetone and ultrasonic application to remove unnecessary Pt film. Thus, the lower electrode 4 was formed.

In turn, like in the preceding step, portions other than the hatched portion as shown in FIG. 8 were covered with phosphosilicate glass of about 3 μm thickness. On the resulting surface was formed a pyroelectric film of PZT (Pb—Zr—Ti—O) to about 2 μm thickness by sputtering in a gas (Ar:$O_2$=9:1) at 10 mTorr with the substrate temperature set at about 500° C. or higher. Thereafter, the phosphosilicate glass layer was removed using hydrofluoric acid to provide a pyroelectric film 5 only in the hatched portion of FIG. 8.

Further, the resulting surface except for the portion intended for the formation of an upper electrode was covered with a resist, and then an Ni—Cr film (not shown) to serve as both the upper electrode 6 and an infrared absorption layer was deposited to about 1000 Å thickness on the resulting surface by sputtering. The resist layer was then removed using a solvent to form a structure wherein the pyroelectric film 5 was sandwiched between the upper and lower electrodes 4 and 6 (refer to FIG. 9. In turn, the structure thus constructed was subjected to a heat treatment to phase separate the spacer of borosilicate glass into $Na_2O$—$B_2O_3$ phase and $SiO_2$ phase. The phase separated borosilicate glass was etched using diluted hydrochloric acid heated to 90° C. to remove the $Na_2O$—$B_2O_3$ phase through mainly the rectangular etching holes 10, whereby the borosilicate glass was rendered porous. The procedure thus described afforded an infrared detecting element of the structure comprising the support member 2 of $Si_3N_4$, lower electrode 4, pyroelectric film 5, upper electrode 6 and porous, low thermal conduction part 8 which also served to support the detection part, as shown in FIG. 9.

The infrared detecting element thus fabricated was electrically connected to an external signal processing circuit part through upper and lower leads extending from the infrared detecting element to form an infrared detector apparatus. By employing such an arrangement, heat derived from infrared rays incident on the detection part allowed the temperature of the detection part to rise efficiently, thereby assuring improved detection sensitivity, since the thermal conduction from the peripheral portion or lower portion of the detection part was suppressed to a very large extent. In addition, since the porous glass part mechanically supported the bridging detection part, the infrared detector apparatus comprised a detecting element of bridge structure having an improved mechanical strength and hence was capable of performing an improved strength against a very large stress such as an impact.

EXAMPLE 4

A signal processing circuit part such as an FET was formed in a region of an Si substrate, on which region an infrared detection structure was to be formed. In turn, on a surface of the Si substrate was deposited an $Si_3N_4$ film having about 2000 Å thickness to serve as a support member 2 by CVI) process. On the surface of the thus formed $Si_3N_4$ film for the formation of a detection part was formed a phosphosilicate glass layer to about 2 μm thickness, followed by patterning. Further, on the resulting surface was formed an $Si_3N_4$ film to about 1000 Å thickness by CVD process. The upper $Si_3N_4$ film was partially removed at hatched portions defined according to a pattern similar to that shown in FIGS. 6(a) and 6(b) which defined a central detection part, etching holes, hook-like-shaped thermal isolation slits located adjacent respective link portions for increasing the thermal conduction resistance and a throughhole for the connection between the signal processing circuit part in the underlying Si substrate and the detection part. In this case, the length of one side of the central detection part was about 50 μm, the width of each slit was about 1 μm, the length of one side of each slit was about 10 μm, and the width of thermal conduction path defined outside each slit was about 2 μm.

In turn, portions other than the portion intended for the formation of a lower electrode 4 were covered with a resist, and then a Pt film of about 1000 Å thickness to serve as the lower electrode 4 was formed over the resulting surface by sputtering, whereupon the connection between the Pt film and the underlying signal processing circuit part was made. Thereafter, the resist was solved by a solvent such as acetone and ultrasonic application to remove unnecessary Pt film. Thus, the lower electrode 4 was formed as shown in FIG. 7.

In turn, like in the preceding step, portions other than the hatched portion as shown in FIG. 8 were covered with phosphosilicate glass of about 3 μm thickness. On the resulting surface was formed a pyroelectric film of PZT (Pb—Zr—Ti—O) to about 2 μm thickness by sputtering in a gas (Ar:$O_2$=9:1) at 10 mTorr with the substrate temperature set at about 500° C. or higher. Thereafter, the upper glass layer was removed using hydrofluoric acid to provide a pyroelectric film 5 only in the hatched portion of FIG. 8.

Figure 10:
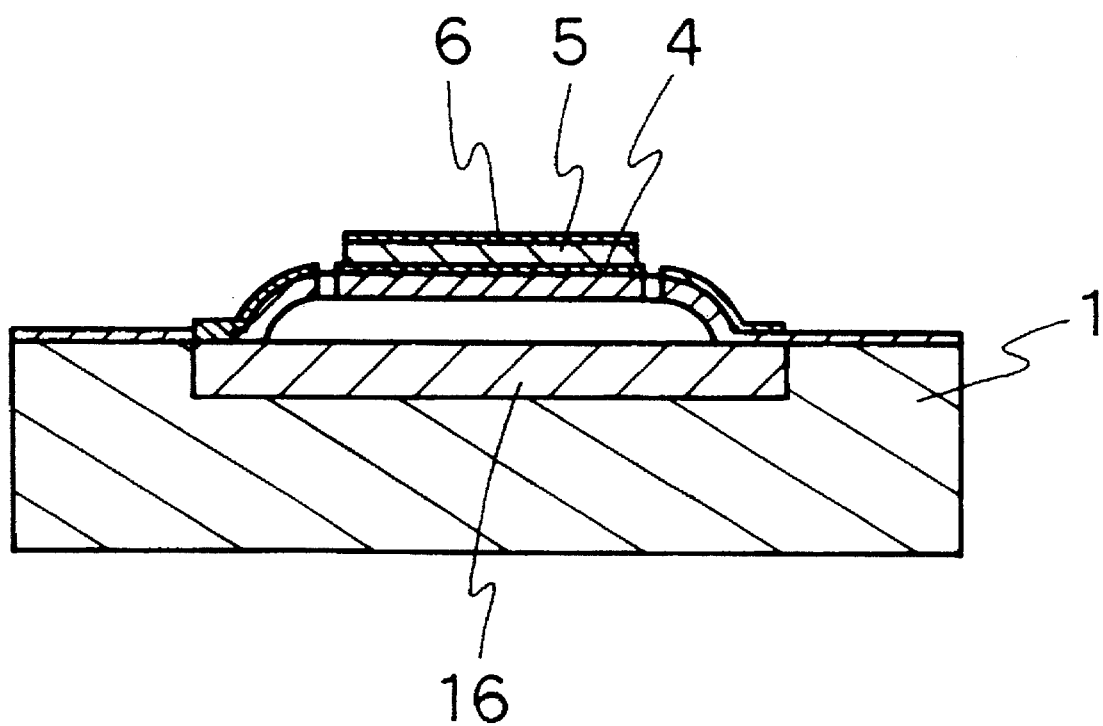
FIG. 10 is an explanatory sectional view of yet another embodiment of an infrared detecting element according to the present invention.

Further, the resulting surface except for the portion intended for the formation of an upper electrode shown in FIG. 5(b) was covered with a resist, and then an Ni—Cr film to serve as both the upper electrode and an infrared absorption layer was deposited to about 1000 Å thickness on the resulting surface by sputtering. The resist layer was then removed using a solvent to form a structure wherein the pyroelectric film was interposed between the upper and lower electrodes. Further, the phosphosilicate glass layer underlying this structure was removed by etching using hydrofluoric acid through mainly the rectangular etching holes. The procedure thus described afforded an infrared detecting element of the integral structure comprising the signal processing circuit 16, support member 2 of $Si_3N_4$, lower electrode 4, pyroelectric film 5 and upper electrode 6 as illustrated in FIG. 10. By employing such arrangement, heat derived from infrared rays incident on the detection part allowed the temperature of the detection part to rise efficiently, thereby assuring improved detection sensitivity, since the thermal conduction from the peripheral portion or lower portion of the detection part was suppressed to a very large extent.

As has been described, with the infrared detecting element structure according to the present invention there can be obtained a sufficient resistance against the thermal conduction from the detecting element to its surrounding portions without largely decreasing the areal ratio of the detection part to a pixel. Further, the provision of the low thermal conduction structure under the detection part allows incident infrared rays to raise the temperature of the detection part efficiently, thereby assuring a high sensitivity. In addition, it is possible to make the infrared detecting element structure have an excellent mechanical strength if the porous material or the like is used.

When a plurality of infrared detecting elements according to the present invention are arranged in array, each detecting element offers, as well as high sensitivity, less crosstalk with the elements adjacent thereto and hence assures a dear image. Further, the detection part is able to be formed integrally with a signal processsing circuit part. In this case the detecting element exhibits a more excellent sensitivity.

While only certain presently preferred embodiments have been described in detail, as will be apparent with those familiar with the art, certain changes and modifications can be made without departing from the spirit and scope of the invention as defined the following claims.

What is claimed is:

1. An infrared detecting element comprising an infrared detecting member, a support member supporting the infrared detecting member, a substrate holding the support member, and a low thermal conduction part intervening between the substrate and a central portion of the support member, the support member having a connecting portion in at least a peripheral portion thereof which connects the support member to the substrate, wherein slits and/or grooves are formed in a place positioned in a circumferential part of said support member, said place neighboring said connecting portion, said slits and/or grooves preventing a thermal quantity generated at the detecting member due to incident infrared rays from escaping.

2. The infrared detecting element of claim 1, wherein said low thermal conduction part comprises a cavity portion provided between said support member and said substrate.

3. The infrared detecting element of claim 1, wherein said low thermal conduction part comprises a porous member provided between said support member and said substrate.

4. The infrared detecting element of any one of claims 1 to 3, said slits or said grooves each have a difference in width between one end and the other end thereof.

5. The infrared detecting element of any one of claims 1 to 3, wherein said slits or said grooves are defined along the peripheral edge of said support member.

6. The infrared detecting element of claim 5, wherein said slits or said grooves define at least two circuits along the peripheral edge of said support member, the slits or grooves in the inner circuit being located as covering portions intervening between the slits or grooves in the outer circuit.

7. The infrared detecting element of any one of claims 1 to 3, wherein said slits and/or said grooves overlap mutually.

8. An infrared detecting element comprising a substrate, a porous member having a low thermal conductance and disposed on the substrate, a support member formed of a thin insulator film and disposed on the porous member, and an infrared detecting member disposed on a surface of the support member.

9. A method for fabricating an infrared detecting element including a substrate, a low thermal conduction part disposed on a surface of the substrate, a support member disposed on the low thermal conduction part and an infrared detecting member disposed on a surface of the support member, the method comprising the steps of:

defining a concave portion into the substrate at a location where the infrared detecting member is to be formed;

filling the concave portion with an easy-to-etch material made of a material to be easily etched or a material to be easily etched while retaining a porous skeleton having a low thermal conductance;

sequentially stacking the support member and the infrared detecting member on the easy-to-etch material, followed by patterning; and etching the easy-to-etch material to define a cavity portion or to form a porous member.

10. A method for fabricating an infrared detecting element including a substrate, a low thermal conduction part disposed on a surface of the substrate, a support member disposed on the low thermal conduction part and an infrared detecting member disposed on a surface of the support member, the method comprising the steps of:

forming a convex portion on a surface of the substrate at a location where the infrared detecting member is to be formed, the convex portion being formed of an easy-to-etch material made of a material to be easily etched or a material to be easily etched while retaining a porous skeleton having a low thermal conductivity;

sequentially stacking the support member and the infrared detecting member on the substrate including the convex portion, followed by patterning; and etching the convex portion to define a cavity portion or to form a porous member.

11. A method for fabricating an infrared detecting element including a substrate, a low thermal conduction part disposed on a surface of the substrate, a support member disposed on the low thermal conduction part and an infrared detecting member disposed on a surface of the support member, the method comprising the steps of:

forming a spacer on a surface of the substrate at a location where the infrared detecting member is to be formed, the spacer being formed of an easy-to-etch material made of a material to be easily etched or a material to be easily etched while retaining a porous skeleton having a low thermal conductivity;

forming an intermediate layer made of a material hard to etch having a high thermal conductance on a surface of the substrate at a location where the infrared detecting element is not to be formed;

sequentially stacking the support member and the infrared detecting member on the spacer, followed by patterning; and etching the spacer to define a cavity portion or form a porous member.

12. A method for fabricating an infrared detecting element comprising the steps of:

stacking on a substrate a support member and an infrared detecting member, followed by patterning;

etching a spacer provided between the substrate and the support member or a surface of the substrate lying under the support member to define a cavity portion between the support member and the substrate; and filling the cavity portion with a porous member forming material, followed by a post-treatment to form a porous member.

13. An infrared detecting element comprising a signal processing circuit part formed in a superficial portion of a semiconductor substrate, a support member formed of a thin insulator film and disposed above the signal processing circuit part with intervention of a cavity portion between the support member and the signal processing circuit part, and an infrared detecting member disposed on a surface of the support member.

14. An infrared detector apparatus comprising infrared detecting elements of the type same as an infrared detecting element as recited in any one of claims 1, 8 and 13 which are arranged one- or two-dimensionally.

15. An infrared detector apparatus comprising an infrared detecting element section having infrared detecting elements as recited in claim 14, and a sealing container accommodating the infrared detecting element section and provided, at its inside, with a vacuum, a reduced pressure atmosphere or a low thermal conduction gas atmosphere.

16. An infrared detecting element comprising:

an infrared detecting member;

a support member supporting said infrared detecting member; and a substrate holding said support member, wherein on an underside of said support member, a low thermal conduction part is interposed between said support member and said substrate, a circumferential part of said support member is partially separated from said substrate by partially forming etching holes in said substrate, said support member is held by means of a connection portion defined by a part where an etching hole is not formed, and slits and/or grooves are formed in a place positioned in said circumferential part of said support member, said place neighboring said connecting portion.

17. An infrared detecting element comprising an infrared detecting member, a support member supporting the infrared detecting member, a substrate holding the support member, and a low thermal conduction pan intervening between the substrate and a central portion of the support member, the support member having a connecting portion in at least a peripheral portion thereof which connects the support member to the substrate, wherein slits and/or grooves are formed in a place positioned in a circumferential part of said support member, said place neighboring said connecting portion.

18. The infrared detecting element of claim 1, further comprising etch holes for etching the substrate.

* * * * *